United States Patent [19]
Huijsing et al.

[11] Patent Number: 5,734,297
[45] Date of Patent: Mar. 31, 1998

[54] RAIL-TO-RAIL INPUT STAGES WITH CONSTANT $G_M$ AND CONSTANT COMMON-MODE OUTPUT CURRENTS

[75] Inventors: Johan Hendrik Huijsing, Schipluiden; Ronald Hogervorst, Voorschoten, both of Netherlands

[73] Assignee: Philips Electronics North America Corporation, NY, N.Y.

[21] Appl. No.: 625,458

[22] Filed: Mar. 29, 1996

[51] Int. Cl.$^6$ ............................................. H03F 3/45
[52] U.S. Cl. ................................. 330/253; 330/258
[58] Field of Search ................................ 330/252, 253, 330/258, 261

[56] References Cited

U.S. PATENT DOCUMENTS

| | | | |
|---|---|---|---|
| 4,555,673 | 11/1985 | Huijsing et al. | 330/258 |
| 5,208,552 | 5/1993 | Ryat | 330/253 |
| 5,323,120 | 6/1994 | Ryat | 330/252 |
| 5,561,396 | 10/1996 | Hogervorst et al. | 330/258 X |

OTHER PUBLICATIONS

R. Hogervorst et al, "A Compact Power–Efficient 3V CMOS Rail–to–Rail Input/Output Operational Amplifier for VLSI Cell Libraries", IEEE Intn'l Solid–State Cir. Conf., Session 14, 1994, pp. 244–245.

R. Hogervorst et al, "CMOS Low–Voltage Operational Amplifiers with Constant–$g_m$ Rail–to–Rail Input Stage", Analog Integrated Circuits and Signal Processing 5, 1994, pp. 135–146.

M.D. Pardoen et al, "A Rail–to–Rail Input/Output CMOS Power Amplifier", IEEE Journal of Solid–State Circuits, vol. 25, No. 2, Apr. 1990, pp. 501–504.

J.H. Huijsing et al, "Low–Voltage Operational Amplifier with Rail–to–Rail Input and Output Ranges", IEEE Journal of Solid–State Circuits, vol. sc–20, No. 6, Dec. 1985, pp. 1144–1150.

J.H. Botma et al, "A low–voltage CMOS Op Amp with a rail–to–rail constant–$g_m$ input stage and a class AB rail–to–rail output stage, IEEE, 1993, pp. 1314–1317.

*Primary Examiner*—James B. Mullins
*Attorney, Agent, or Firm*—Brian J. Wieghaus

[57] ABSTRACT

A rail-to-rail input stage with constant $g_m$ and constant common-mode output currents is provided. The common-mode output currents are controlled by the use of current switches. When low and high common-mode input voltages are applied to the input stage, the current switches take part of the tail currents of the input stage transistors, divides it into two equal parts, and directs the two equal current signals to the outputs. When intermediate common-mode input voltages are applied, the current switches regulate the tail currents of the input pairs such that the common-mode output current and $g_m$ remains constant. The current switches are responsive to changes in the common-mode input voltages, and thereby maintain the $g_m$ constant.

18 Claims, 9 Drawing Sheets

RAIL-TO-RAIL INPUT STAGES WITH CONSTANT $G_M$ AND CONSTANT COMMON-MODE OUTPUT CURRENTS

BACKGROUND OF THE INVENTION

1. Field of the Invention

The present invention relates to operational amplifiers. More particularly, it relates to rail-to-rail input stages with constant transconductance ($g_m$) and constant common-mode output currents.

2. The Prior Art

A rail-to-rail input stage can be composed of an N-type and a P-type transistor in parallel. When the common-mode input voltage of such an input stage moves from one part of the common-mode input range into another, the transconductance ($g_m$) changes with a factor of 2. This impedes optimal frequency compensation, since the unity-gain frequency of an amplifier is proportional to the $g_m$ of the input stage. To obtain an optimal frequency compensation over the common-mode input range, the $g_m$ of the input stage has to be constant. (J. H. Huijsing and D. Linebarger, "Low-Voltage operational amplifier with rail-to-rail input and output ranges", IEEE J. Solid-State Circuits, vol. SC-20, pp. 1144–1150, Dec. 1985).

Several other methods for controlling the transconductance ($g_m$) have been reported for bipolar, as well as CMOS technology. For a complementary input stage designed in bipolar, a current switch is used to obtain a constant $g_m$. (J. H. Huijsing and D. Linebarger, "Low-Voltage operational amplifier with rail-to-rail input and output ranges", IEEE J. Solid-State Circuits, vol. SC-20, pp. 1144–1150, Dec. 1985)

U.S. Pat. No. 4,555,673 to Huijsing et al., discloses a differential amplifier with rail-to-rail input capability and controlled transconductance ($g_m$). The method employed for controlling the transconductance uses current control or current switches to steer at least part of the supply current away from at least one of the differential portions of the input stage when the common mode voltage is in at least one part of the supply range.

If the CMOS complementary input stage is operating in strong inversion, a constant $g_m$ can be obtained by using square root circuits or three times current mirrors. (Botma, J. H., et al., "A low-voltage CMOS operational amplifier with rail-to-rail constant-$g_m$ input stage and class-AB rail-to-rail output stage", Proceeding ISCAS93, pp.1314–1317; Hogervorst, R. et al., "CMOS low-voltage operational amplifiers with constant-$g_m$ rail-to-rail input stage", Proceedings ISCAS92, pp.2876–2879; R. Hogervorst, J. P. Tero, R. G. H. Rschauzier, J. H. Huijsing, "A compact power-efficient rail-to-rail input/output amplifier for VLSI cell libraries", in Digest ISSCC94, Feb 1994.) For CMOS complementary input stages operating in weak inversion a current switch can be used to obtain a constant $g_m$ (M. D. Pardoen, M. G. DeGrauwe, "A rail-to-rail input/output CMOS power amplifier" IEEE J. Solid-State Circuits, vol SC-25, pp. 501–504, Dec. 1990).

The above described complementary input stages have a common drawback, (i.e., the common-mode output currents of the input pairs change). These currents load the summing circuit, and vary as a function of the common-mode input voltage. As a result, the biasing currents in the summing circuit vary. For several different reasons this variation is unacceptable. An operational amplifier might need a floating current source, which is, in general, difficult to design (R. Hogervorst, J. P. Tero, R. G. H. Rschauzier, J. H. Huijsing, "A compact power-efficient rail-to-rail input/output amplifier for VLSI cell libraries" in Digest ISSCC94, Feb 1994). The offset contribution of the summing circuit to the input of the operational amplifier changes, resulting in a lowering of the common-mode rejection ratio (CMRR). To cope with the varying bias currents in the summing circuit, multipath frequency compensation can become very complicated, because each time a path is added, the amount of input transistors has to be doubled. Particularly for rail-to-rail input stages, this results in a relatively large area consumption.

The present invention overcomes the drawbacks of previous solutions and provides rail-to-rail inputs stages with constant $g_m$ and constant common-mode output currents.

SUMMARY OF THE INVENTION

The invention provides a rail-to-rail input stage with constant $g_m$ and constant common-mode output currents. A current switch is coupled to each of the input pairs of transistors and a voltage source. The voltage source provides reference and bias signals to the gates of the current switches. When common-mode input voltages are applied to the input stage, the current switches compare the input voltage with the value of the voltage source, and determine which of the input pairs should operate. Upon activation of an input pair, the current switches take the tail current of the non-active pair, divide it into two equal parts, and direct the two equal current signals to the output. Thus, the output currents received by the summing circuit connected to the input stage are constant. This control circuit can be embodied using MOS, CMOS, and Bipolar technology.

In another embodiment of the invention, the voltage source, connected to the current switches, applies a voltage difference to the gates of the current switches. The application of a voltage difference to the gates of the current switches enables the $g_m$ values of the current switches to be small with respect to the values of the input pairs of transistors. By decreasing the $g_m$ values of the current switches with respect to the input pairs, the noise and offset contributions to the input stage caused by the addition of the current switches is significantly decreased, and almost eliminated.

It is therefore an object of the present invention to provide a circuit for maintaining the common-mode output currents and the $g_m$ of the rail-to-rail input stage of an operational amplifier at a constant value.

It is another object of the invention to provide a circuit for maintaining the common-mode output currents of the rail-to-rail input stage of an operational amplifier constant to facilitate the biasing of the summing circuit connected to the input stage.

It is yet another object of the invention to provide a circuit for maintaining the common-mode output currents of the rail-to-rail input stage of an operational amplifier constant such that the summing circuit connected to the input stage does not contribute to offset changes of the amplifier.

A further object of the invention is to provide a circuit for maintaining the common-mode output currents of the rail-to-rail input stage of an operational amplifier constant and thereby increase the common-mode rejection ratio (CMRR) of the amplifier.

Another object of the invention is to provide a circuit for maintaining the common-mode output currents of the rail-to-rail input stage of an operational amplifier constant to simplify the realization of multipath compensated opamps, and therefore requires less silicon die area.

It is a further object of the invention to provide a circuit for maintaining the common-mode output currents of the rail-to-rail input stage of an operational amplifier constant that operates efficiently and reliably.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
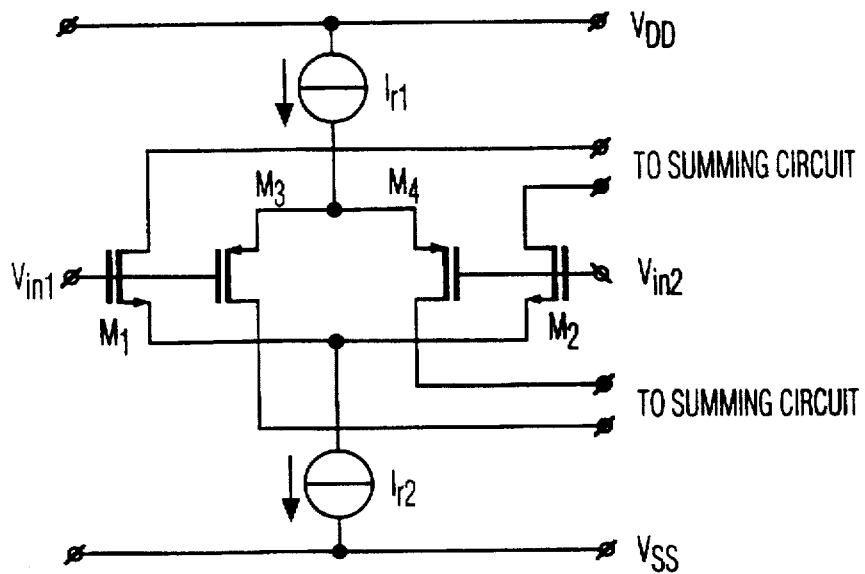
FIG. 1 is a schematic diagram of the input stage of an operational amplifier of the prior art.

FIG. 1 shows an example of an input stage of an operational amplifier of the prior art. As shown, the input stage has a rail-to-rail common-mode input range which can be composed of two complementary differential input pairs. The input stage consists of an N-channel input pair, M1–M2, and a P-channel input pair, M3–M4. The common-mode input voltage range for such an input stage can be divided into three parts: (1) Low common-mode input voltages (only the P-channel input pair operates); (2) Intermediate common-mode input voltages; (both the P-channel and N-channel input pair operate); and, (3) High common-mode input voltages (only the N-channel input pair operates).

When the common-mode input voltage moves from one part of the common-mode input range into another, the transconductance ($g_m$) changes by a factor of two. Thus, since the unity-gain frequency of an amplifier is proportional to the $g_m$ of the input stage, changes in the $g_m$ impedes an optimal frequency compensation. Therefore, in order to obtain optimal frequency compensation over the whole common-mode input range, the $g_m$ of the input stage has to be constant.

Figure 2:
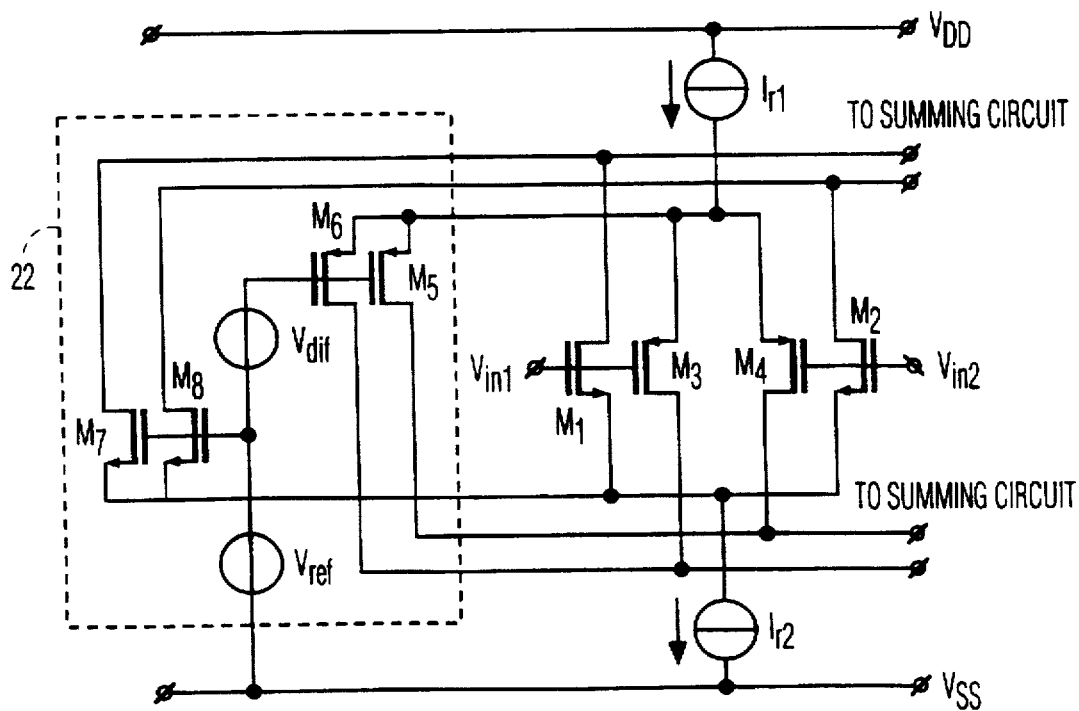
FIG. 2 is a schematic diagram of a rail-to-rail input stage having a constant common-mode output currents according to the invention.

FIG. 2 shows the complementary input stage, $M_1$–$M_4$, with the addition of an output current control circuit 22. Control circuit 22 is a pair of complementary current switches, $M_7$–$M_8$ and $M_5$–$M_6$. The gate of the N-channel current switches ($M_7$–$M_8$) is biased at a value of $V_{SS}+V_{ref}$, while the gate of the P-channel switches ($M_5$–$M_6$) is biased at a value of $V_{SS}+V_{ref}+V_{dif}$.

The current switches compare the common-mode input voltage with their respective gate voltages and decides which input pair should be active. For common-mode input voltages above $V_{SS}+V_{ref}$ the N-channel input pair ($M_7$–$M_8$) is active, while for common-mode input voltages below $V_{SS}+V_{ref}+V_{dif}$ the P-channel input pair ($M_5$–$M_6$) is active.

When an input pair is active, it splits its tail current into two equal common-mode currents and directs those currents to the output. If the input pair is not active, the current switches divide the tail-current of the non-active input pair into two equal parts which are then directed to the output. As a consequence, the common-mode output currents of the input stage are constant over the entire common-mode input range.

The input stage loads the summing circuit with common-mode currents. As a result, the bias currents in the summing circuit do not vary. Therefore, the summing circuit does not contribute to offset changes when the common-mode input voltage swings from rail-to-rail. This results in an increase of the common mode rejection ratio (CMRR) of the input stage. It should be noted, that mismatches of each pair of current switches contributes to the offset change of the amplifier. This contribution can be made small by making the value of the current switches much smaller than that of the input transistors. The constant bias currents in the summing circuit also allow a simple realization of multipath compensated amplifiers.

Figure 3:
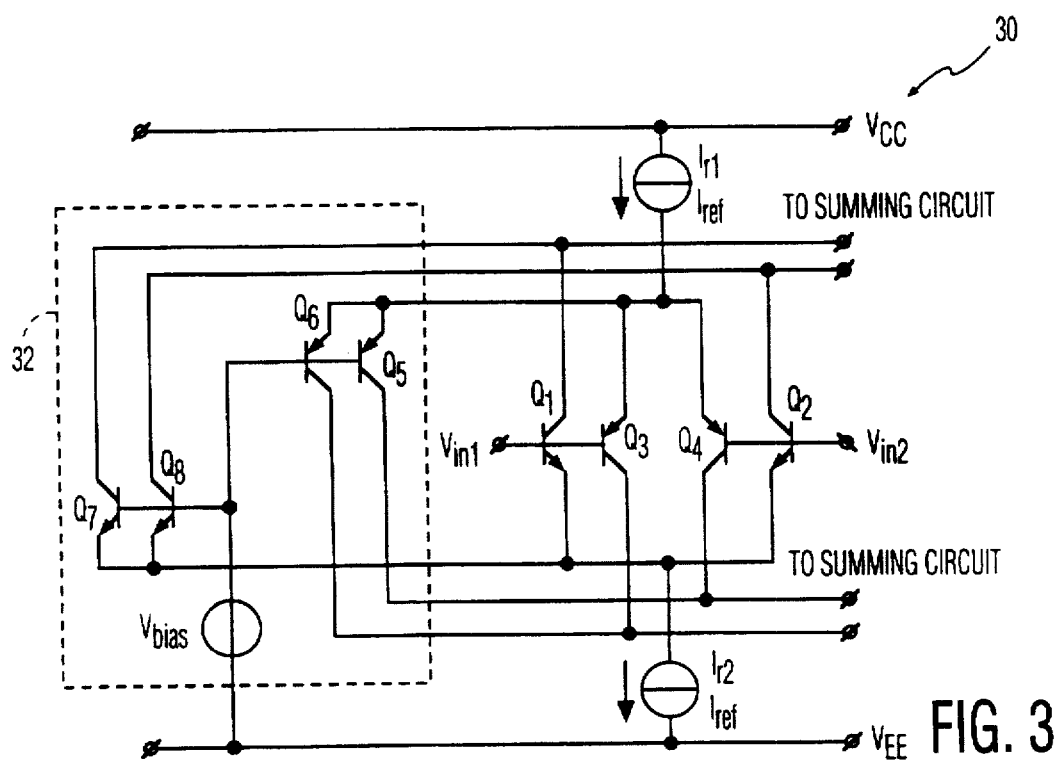
FIG. 3 is a schematic diagram of a constant $g_m$ rail-to-rail input stage having constant common-mode output currents according to the invention.

FIG. 3 shows a bipolar embodiment of the circuit of FIG. 2. Circuit 30 has a control circuit 32 to that of control circuit 22 (FIG. 2), with the difference being that the voltage source $V_{dif}$ has been made equal to zero. As such, not only the common-mode output currents of the input stage have a constant value, but also the $g_m$ is regulated at a constant value. Although the circuit is drawn using bipolar transistors, it can also be used for CMOS input stages operating in weak inversion. The current switches, $Q_5$–$Q_6$, and $Q_7$–$Q_8$, keep the sum of the tail-currents of the input pairs constant. Since, the $g_m$ of a bipolar transistor is proportional to its tail current, the $g_m$ of the rail-to-rail input stage, $Q_1$–$Q_4$, will also be constant. The collectors of $Q_5$–$Q_6$ can be connected to the negative supply, while the collectors of $Q_7$ and $Q_8$ can be connected to the positive supply. Although this results in non-constant common-mode output currents, the $g_m$ is still controlled constant.

To understand the operation of this circuit, the common-mode input range of this circuit can be divided into three parts:

1) If low common-mode input voltages are applied, only the PNP input pair, $Q_3$–$Q_4$, operates. The PNP current switches $Q_5$–$Q_6$ of control circuit 32 are off while the NPN current switches $Q_7$–$Q_8$ conduct. As a result, the PNP input pair is biased by the current $I_{r1}$, which has a value of $I_{ref}$. The PNP input pair ($Q_3$–$Q_4$) splits its tail current into two equal common-mode parts, and directs those currents to the output of the input stage. The NPN current switches, $Q_7$–$Q_8$, take away the current $I_{r2}$, which also has a value of $I_{ref}$, from the non-operating NPN input pair $Q_1$–$Q_2$. The NPN current switches $Q_7$–$Q_8$ also divides the current $I_{r2}$ into two equal common-mode parts and directs these currents to the output.

2) If intermediate common-mode input voltages are applied the PNP as well as the NPN input pairs operate, and the current switches will take away a part of the tail-currents, $I_{r1}$ and $I_{r2}$. If the common-mode input voltages increases, the current through the current switches, $Q_5$–$Q_6$, also increases. However, the current through the other pair of current switches, $Q_7$–$Q_8$, decreases with the same amount. As a result, the sum of the tail currents is kept at value of $I_{ref}$. The common-mode output currents also do not change, because the tail currents are directed to the output, through either a current switch or an input pair.

3) If high common-mode input voltages are applied, only the NPN input pair, $Q_1$–$Q_2$, operates. The PNP current switches $Q_5$–$Q_6$ conduct while the NPN current-switches $Q_7$–$Q_8$ are off. As a result, the NPN pair $Q_1$–$Q_2$ is biased by the current $I_{r2}$, which has a value of $I_{ref}$. The NPN input pair splits the tail current into two equal common-mode currents, and directs those currents to the output. The PNP current switches $Q_5$–$Q_6$ take away the current $I_{r2}$ from the non-operating PNP input pair $Q_3$–$Q_4$, divides it into two equal parts, and directs these currents to the output.

Thus, it can be concluded that the common-mode output currents of the input stage are constant. Also, the sum of the tail currents of the input pairs, and therefore the $g_m$ of the rail-to-rail input stage, is regulated at a constant value.

Figure 4:
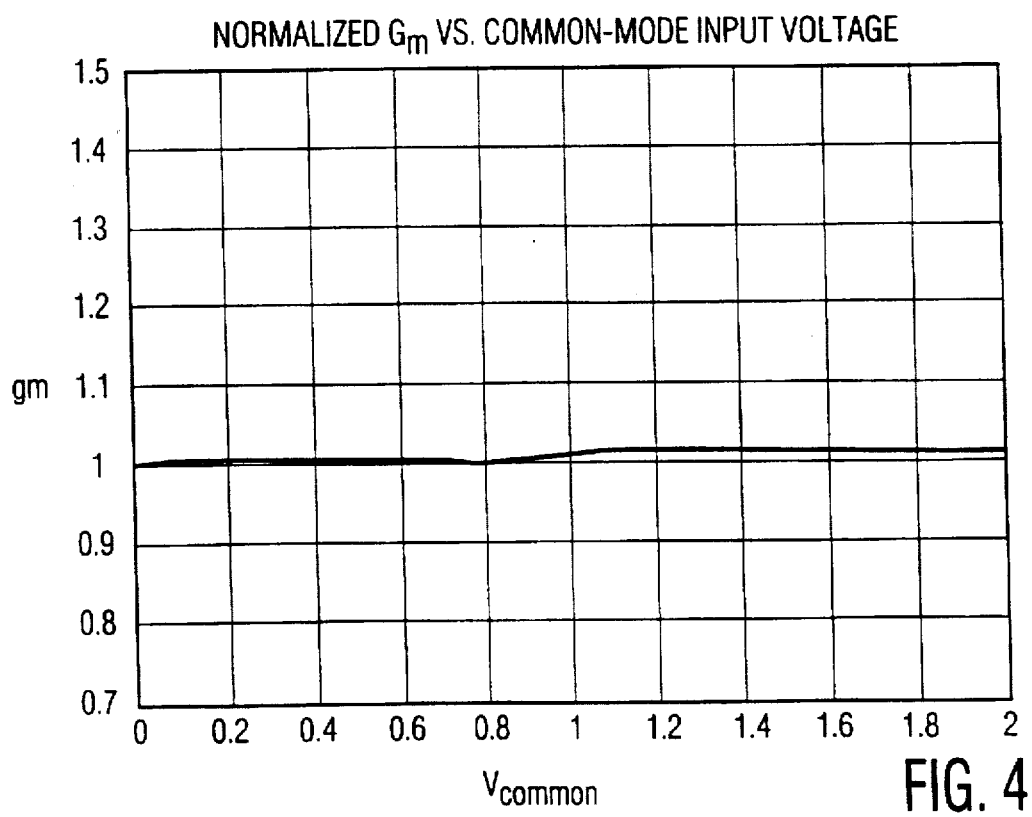
FIG. 4 is graphical representation of the normalized transconductance versus the common-mode input voltage for the circuit of FIG. 3.

FIG. 4 shows a graphical representation of the normalized transconductance versus the common-mode input voltage for the circuit of FIG. 3. As can be seen from the graph, the $g_m$ is approximately constant over the entire common-mode input range.

Figure 5A:
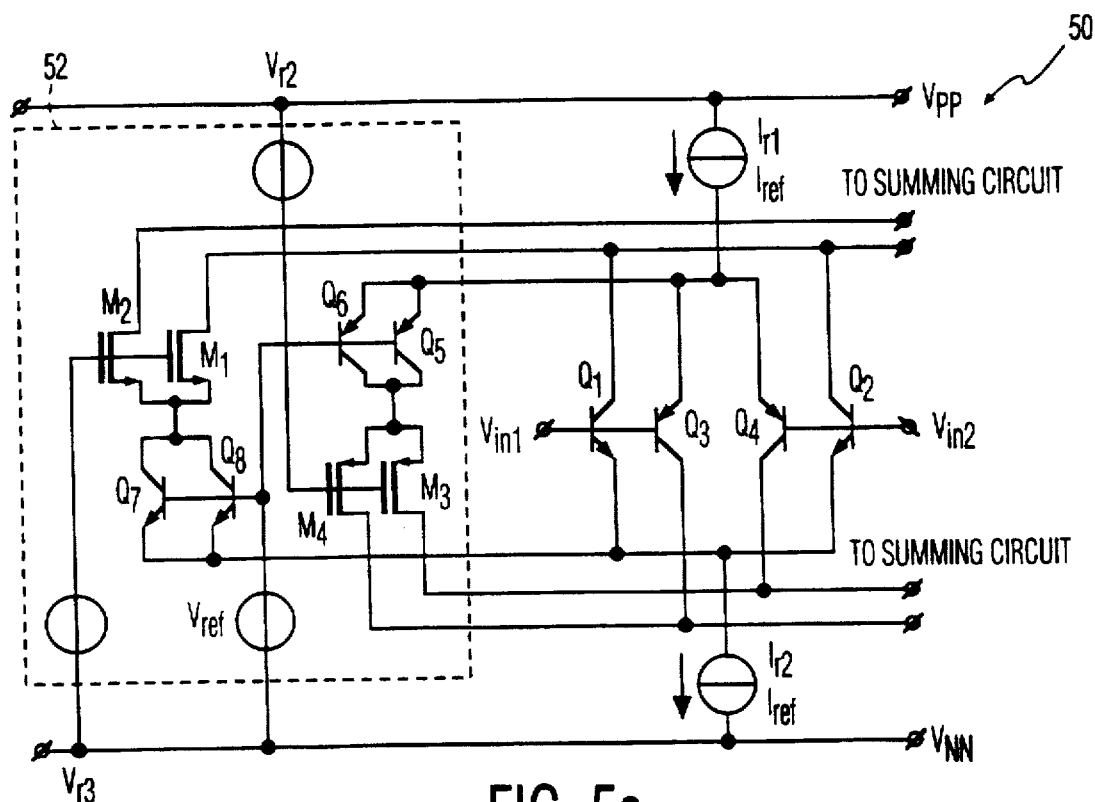
FIG. 5a is a BiCMOS embodiment of a constant $g_m$ rail-to-rail input stage having constant common-mode output currents according to the invention.

FIG. 5a shows a BiCMOS embodiment 50 similar to circuit 30 shown in FIG. 3. The main difference between the two circuits 50 and 30 is in the noise and offset contribution of the current switches. In FIG. 3, the current switches $Q_5$–$Q_6$ and $Q_7$–$Q_8$ split the part of the tail current which is not used for signal amplification into two equal parts. Since these current switches are bipolars, they have a transconductance ($g_m$) which is comparable to that of the input transistors. As such, the current switches contribute to the noise and offset of the input stage. This problem can be overcome in BiCMOS, as is shown in FIG. 5a. In FIG. 5a, the current through the current switches $Q_5$–$Q_8$ of control circuit 52 is split by the MOS transistors $M_1$–$M_4$. In this way, the MOS transistors, instead of the bipolar current switches, contribute to the noise and offset of the input stage. This contribution can be made negligible by giving the MOS transistors a much smaller $g_m$ than the bipolar current switches, which is easily accomplished. This same technique can be applied in CMOS technology, however the additional MOS transistor should have a much smaller W/L ratio than the current-switches.

Figure 5B:
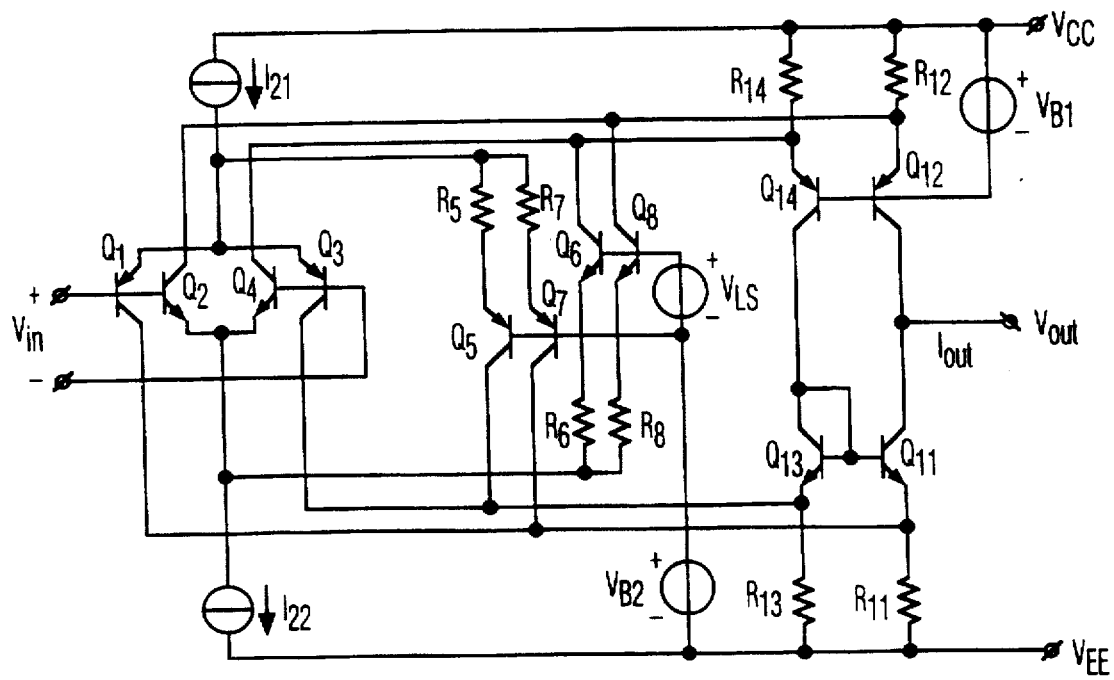
FIG. 5b is an alternative bipolar embodiment of the constant $g_m$ rail-to-rail input stage having constant common-mode output currents according to the invention.

FIG. 5b shows an alternative bipolar embodiment of the circuit shown in FIG. 3. This circuit includes the rail-to-rail input stage $Q_1$–$Q_4$ and current switches $Q_5$–$Q_8$. The current switches $Q_5$–$Q_8$ are degenerated by the resistors $R_5$–$R_8$. These resistors effectively lower the $g_m$ of the current switches, and as such, they reduce the noise and offset contributions of the current switches. In order to obtain a constant $g_m$, the voltage source VLS should have a value of $0.5*I_{ref}*R_5$.

Figure 6:
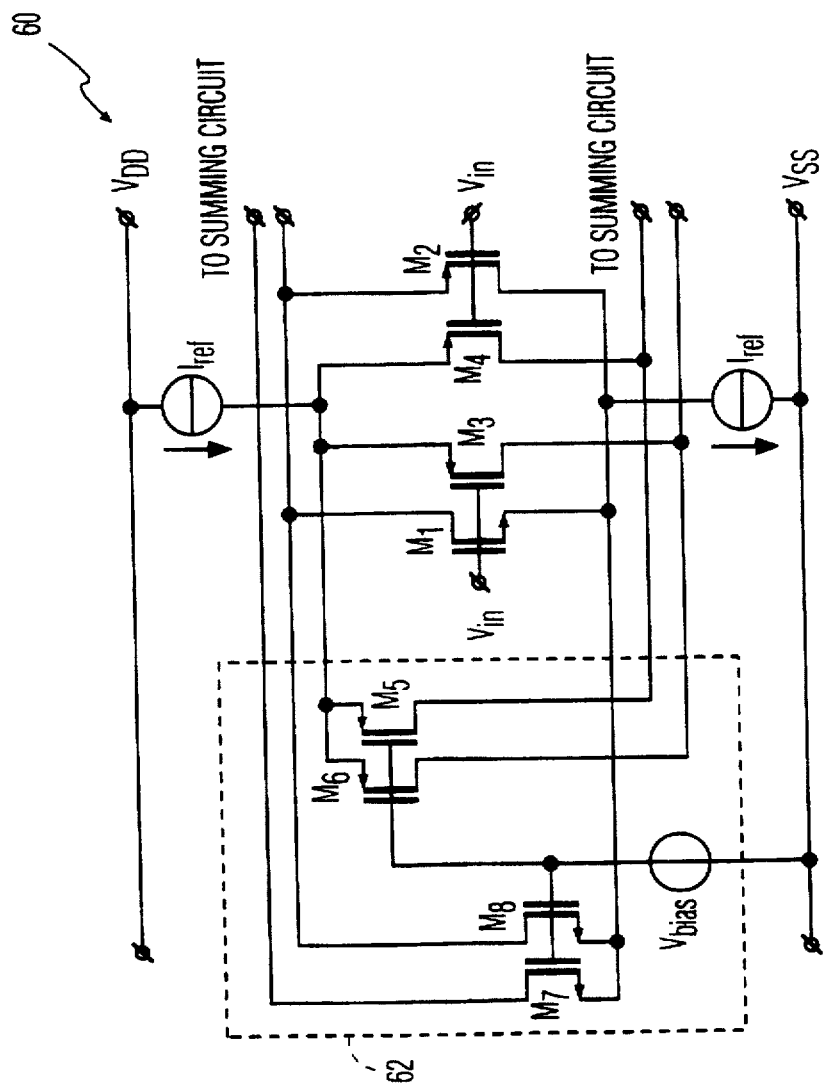
FIG. 6 is schematic diagram of a CMOS constant $g_m$ rail-to-rail output stage operating in strong inversion and having constant common-mode output currents according to the invention.

FIG. 6 shows a CMOS embodiment 60 of circuit 30 of FIG. 3. As shown in the bipolar case of FIG. 3, the voltage source $V_{dif}$ is zero. First, suppose the W/L ratios of $M_5$–$M_6$ and $M_7$–$M_8$, are equal to the W/L ratio of the input transistors which are biased in weak inversion. This circuit now operates like its bipolar counterpart (FIG. 3), and the $g_m$ of the input stage is constant over the common-mode input range.

Figure 7:
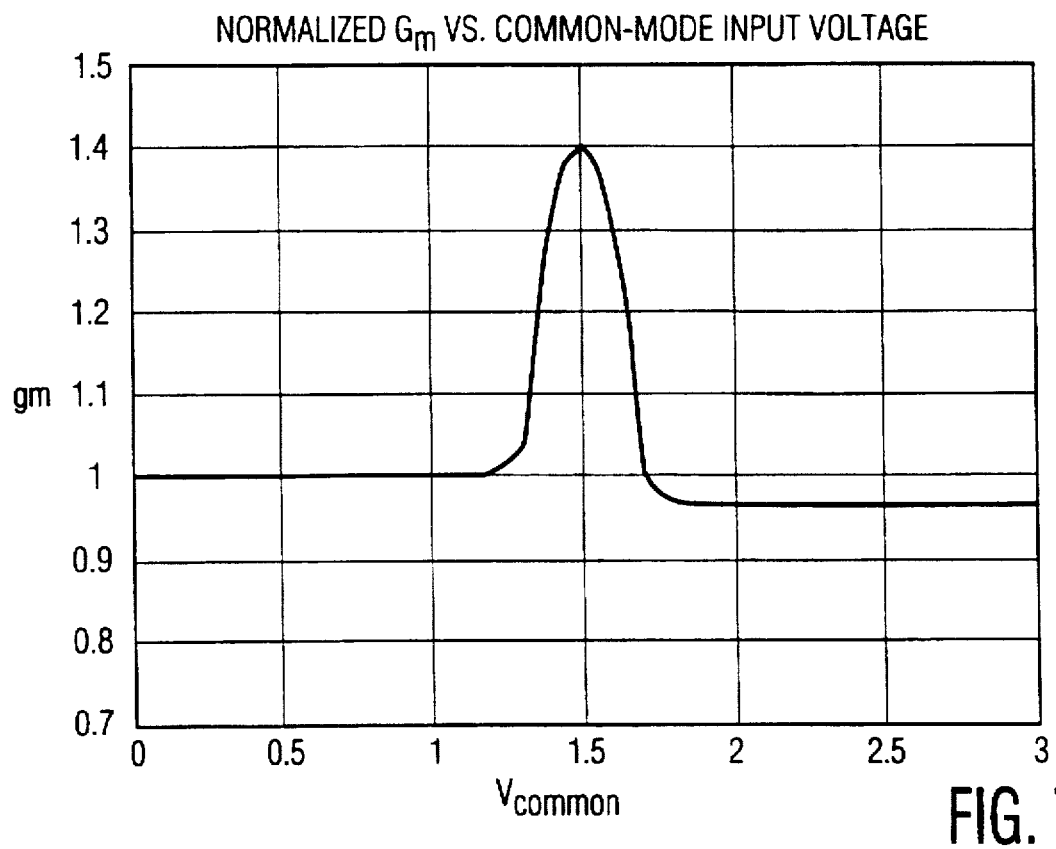
FIG. 7 is a graphical representation of the normalized transconductance versus the common-mode input voltage for a CMOS embodiment of the circuit of FIG. 6 with the input stage operating in strong inversion.

If the input stage operates in strong inversion, the $g_m$ of the input transistors is proportional to the square-root of the input transistors. Because the $g_m$ control keeps the sum of the tail currents of the input pairs constant, the $g_m$ varies about 40% over the entire common-mode input range (FIG. 7). The peak value of the $g_m$ OCCURS when the common-mode input voltage is equal to the bias voltage of the current switches. At this input voltage the tail-currents of the input pairs are equal to $0.5I_{ref}$.

The input stage can be improved for operation in strong inversion by making the W/L ratio of $M_7$–$M_8$ and $M_5$–$M_6$ three times larger than the input transistors, $M_1$–$M_4$. The input stage basically works in the same way as the circuit of FIG. 6, however, in the intermediate part of the common-mode input range, the circuit operates slightly different. If the common-mode input voltage is equal to the bias voltage of the current switches, the current through the switches is three times larger than the currents of the input pairs. As a result, the tail current of the input pairs is equal to $0.25I_{ref}$, resulting in the same $g_m$ as in the outer parts of the common-mode input range. (See FIG. 8)

Figure 8:
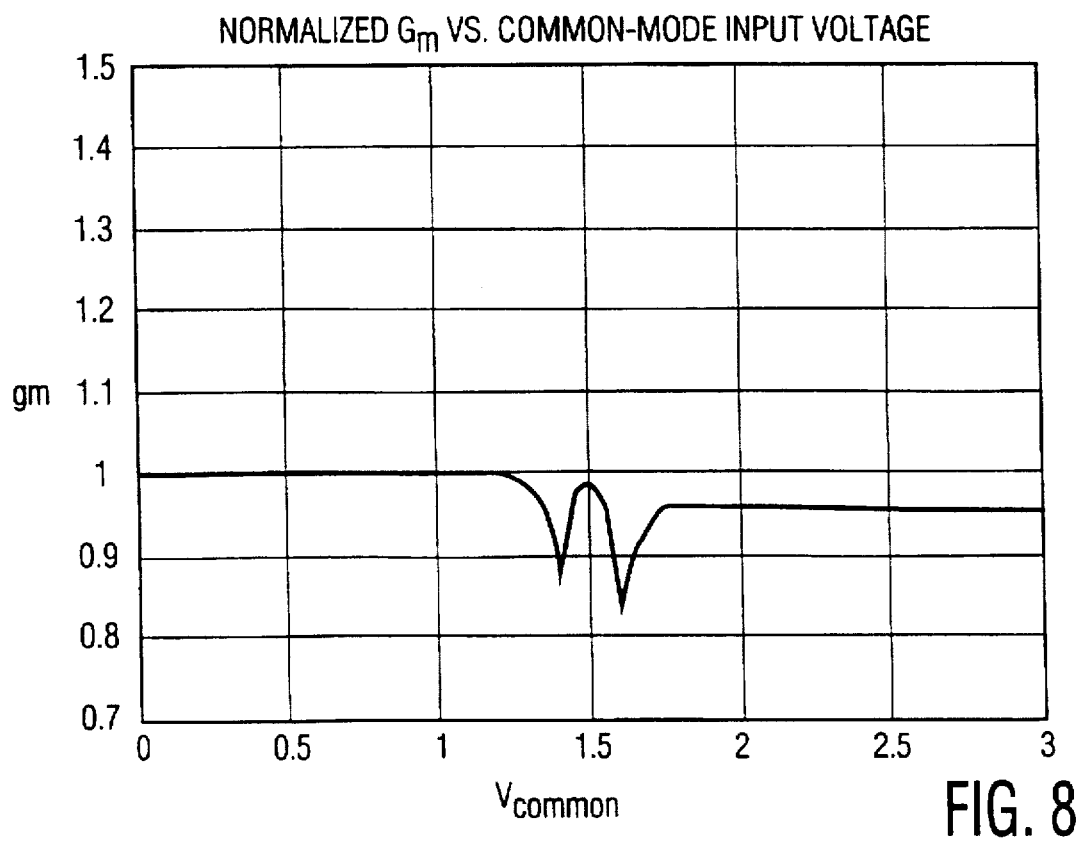
FIG. 8 is a graphical representation of the normalized transconductance versus the common-mode input voltage for the circuit of FIG. 6 with the input pairs operating in strong inversion.

FIG. 8 shows the normalized $g_m$ versus the common-mode input voltage range for the circuit of FIG. 6 operating in strong inversion. The current switches $M_5$–$M_8$ have a W/L which is three times larger than the input transistors (FIG. 6). From this graph, it can be concluded the $g_m$ varies about 17% over the entire common-mode input voltage range.

Figure 9:
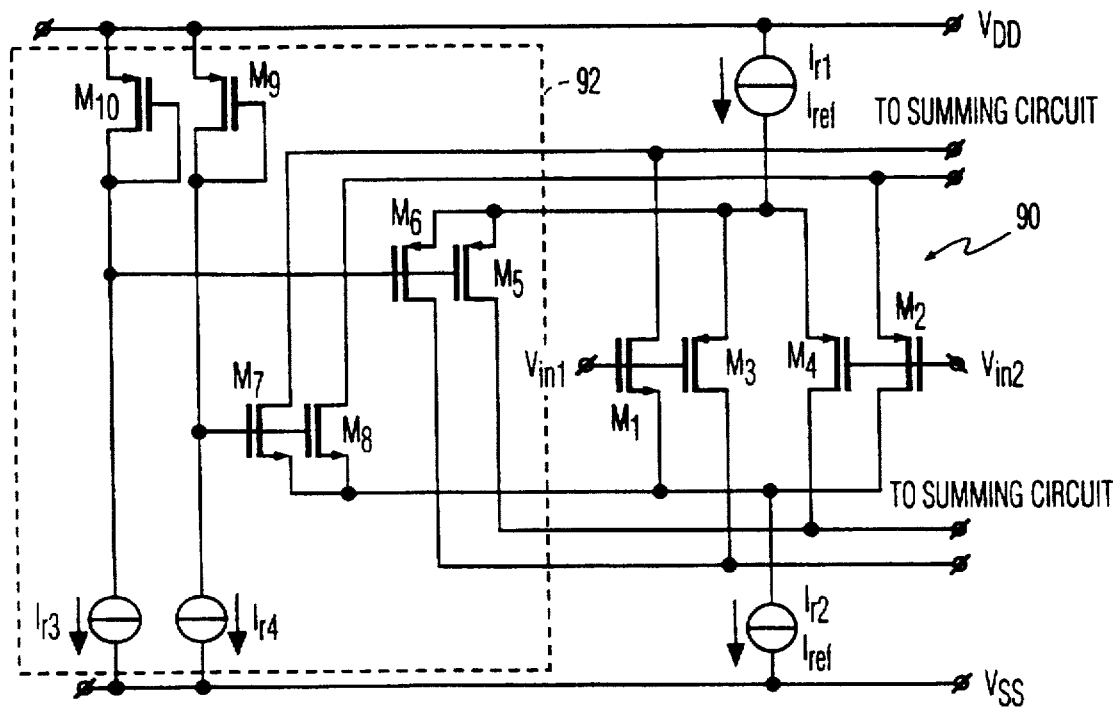
FIG. 9 is a schematic diagram of a CMOS rail-to-rail input stage operating in strong inversion having a constant $g_m$ and constant common-mode output currents according to the invention.
Figure 10:
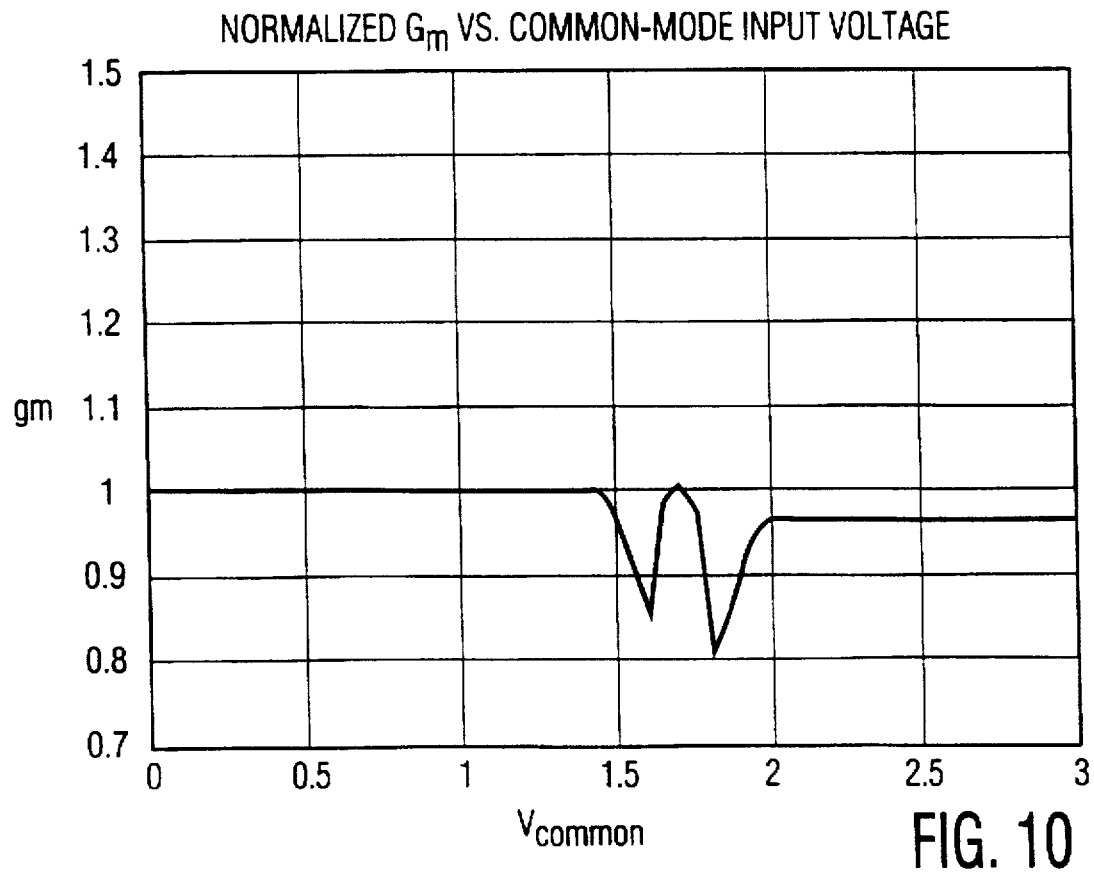
FIG. 10 is a graphical representation of the normalized transconductance versus the common-mode input voltage for the circuit of FIG. 9.

FIG. 9 shows a circuit 90 where the same result can be obtained by applying a voltage difference between the gates of the current switches within control circuit 92. The bias voltage source and the voltage source $v_{dif}$ are realized by $M_9$ and $M_{10}$. Thus, by giving these transistors different aspect ratios, a voltage difference between the gates of the current switches, $M_5$–$M_6$ and $M_7$–$M_8$, is created. The main advantage of this approach is that the values of current-switches, $M_5$–$M_6$ and $M_7$–$M_8$, can be made small compared to the input transistors $M_1$–$M_4$, which tends to decrease the noise and offset contribution of the current switches. Moreover, the offset voltage change is spread out over a large part of the common-mode input range which increases the CMRR. FIG. 10 shows the normalized transconductance versus the common-mode input range for the circuit of FIG. 9. From this figure, it can be concluded that the $g_m$ varies approximately 19% over the entire common-mode input range.

Figure 11:
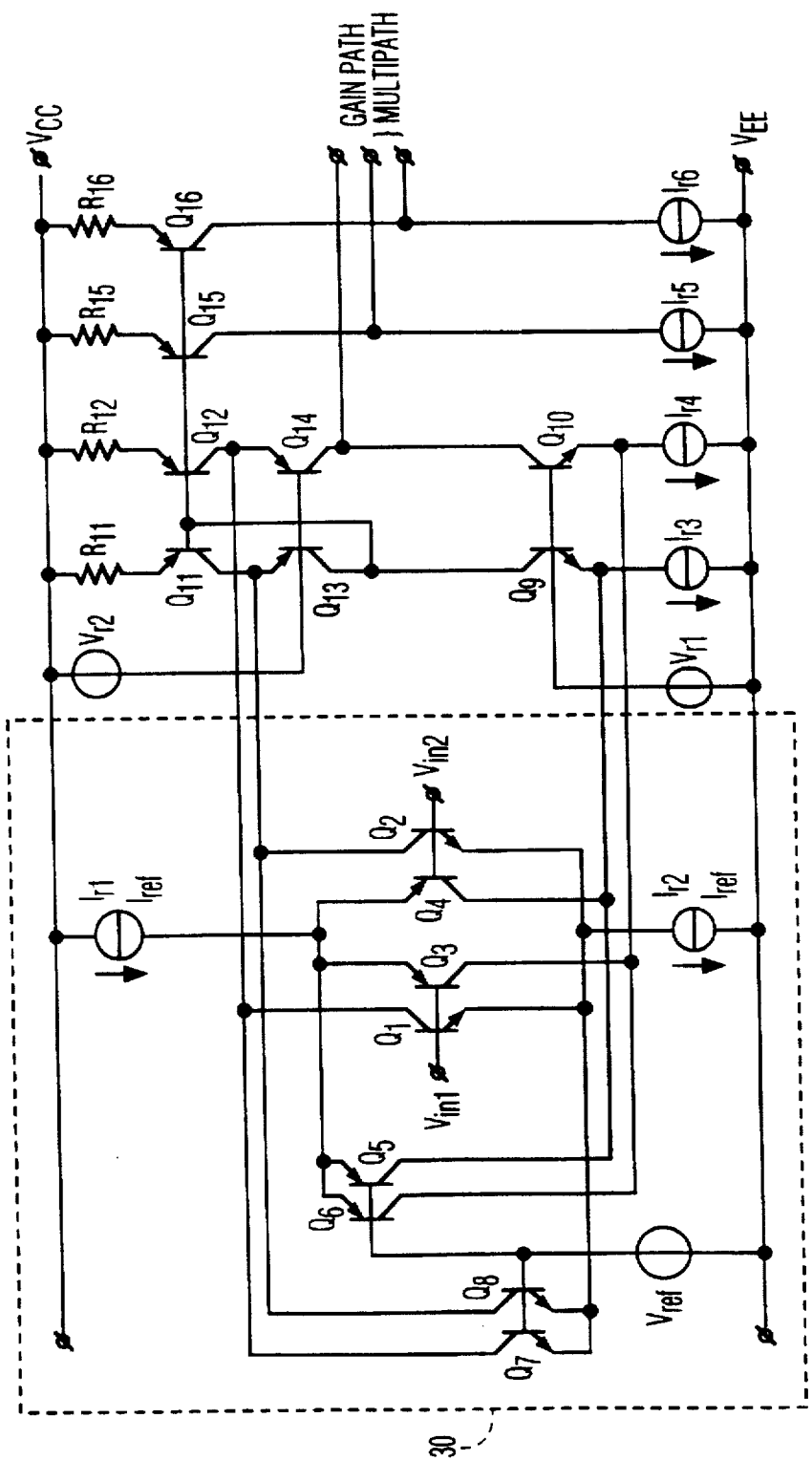
FIG. 11 is a schematic diagram of another embodiment of a rail-to-rail input stage with constant $g_m$ having constant common-mode output currents according to the invention.

FIG. 11 shows a rail-to-rail input stage having with constant $g_m$ and constant common-mode output currents for multipath compensated amplifiers. The circuit consists of a rail-to-rail input stage, $Q_1-Q_8$, having constant common-mode output currents, and a summing circuit, $Q_9-Q_{16}$, with multiple outputs. The multiple outputs can be used for multipath frequency compensation of an operational amplifier. The gain path is used for the low-frequency path with high gain, while the multipaths can be used for the low gain high-frequency path. The signal of the input stage is tapped from $Q_{11}$. Because the input stage has constant common-mode output currents, the current of the transistors $Q_{15}-Q_{16}$ also have a constant value. Therefore, no additional input pairs are needed.

Figure 12:
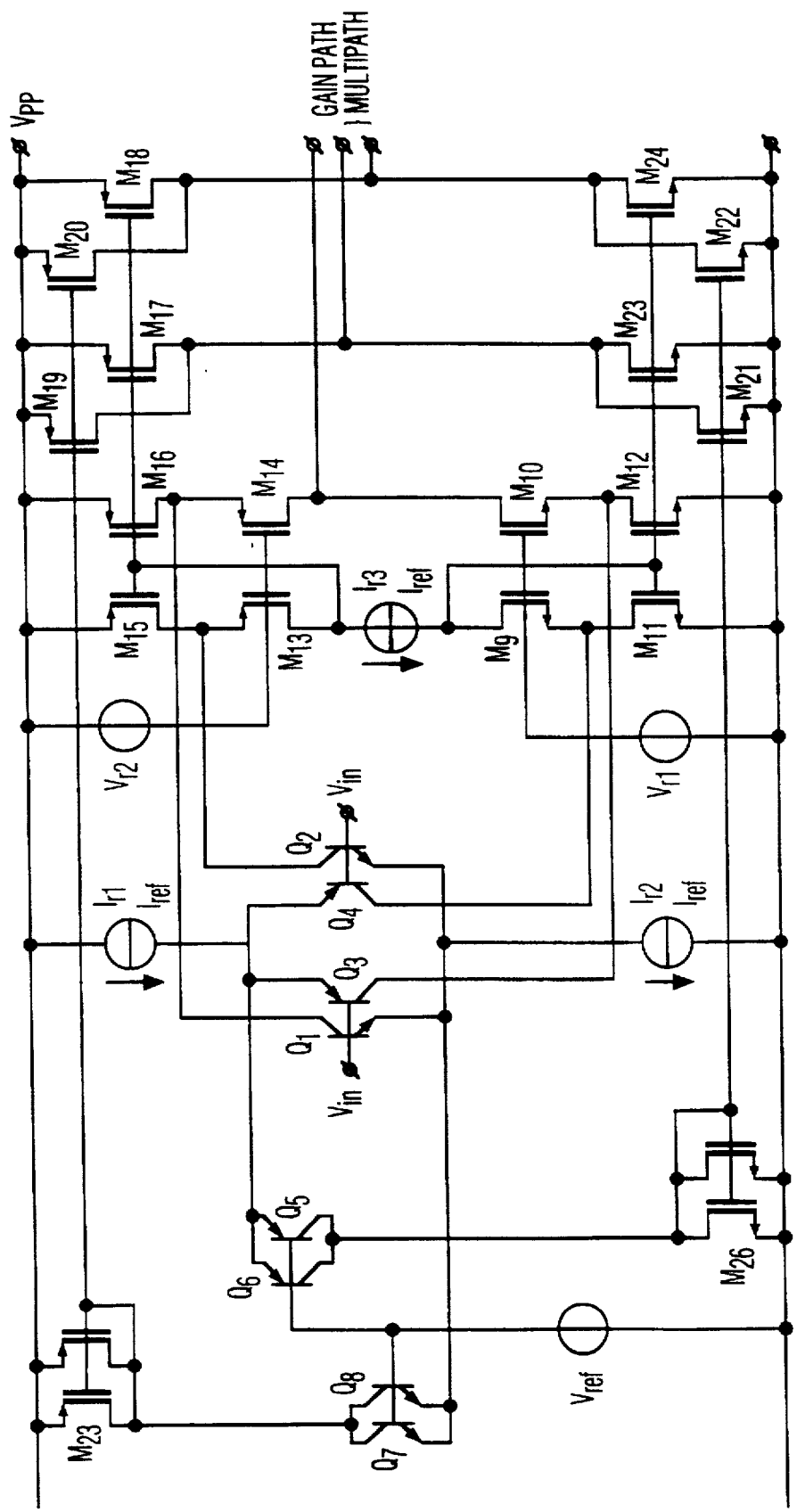
FIG. 12 is a schematic diagram of a first alternative embodiment of the circuit of FIG. 11 according to the invention.

In some applications the extra noise and offset contribution of the current switches is not acceptable. In these cases, the variants as shown in FIG. 12 can be used. In this circuit, only the multipath transistors, $M_{17}-M_{20}$, are biased at a constant current level. This has the same advantage as the circuit of FIG. 11 (i.e., no additional input pairs are necessary). Furthermore, because the control transistors, $Q_5-Q_8$, are not connected with the main signal path, there is no additional noise and offset due to the control transistors, $Q_5-Q_8$. Note that the summing circuit $M_9-M_{14}$ is biased with a floating current source $I_{r3}$.

Figure 13:
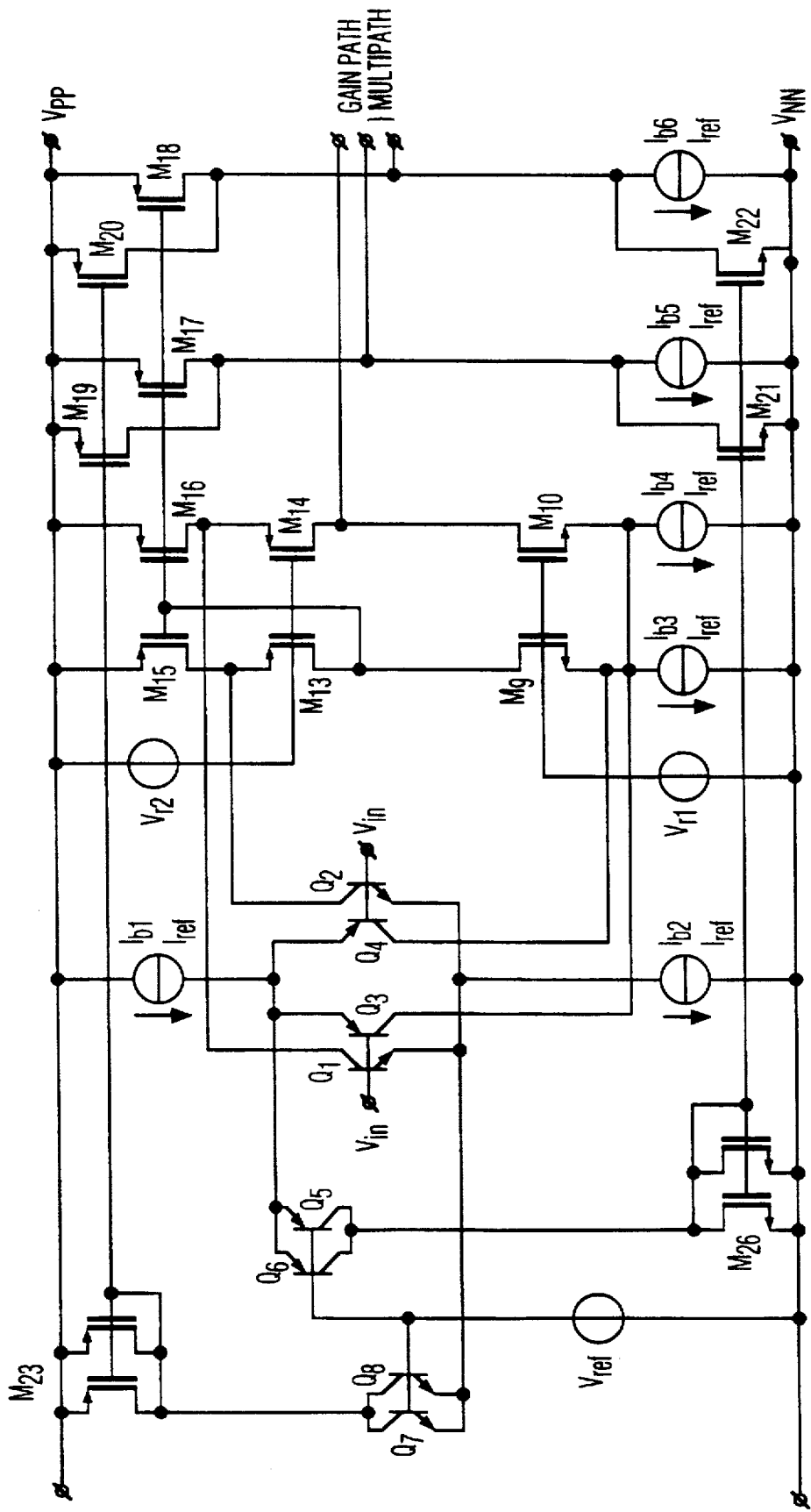
FIG. 13 is a schematic diagram of a second alternative embodiment of the circuit of FIG. 11 according to the invention.

FIG. 13 shows an application which does not require a floating current source to bias the circuit. Although the current levels in the multipath transistors change, the sum of the drain currents of $M_{19}$ and $M_{17}$ (i.e., the drain current of $M_{21}$) change by the same amount. As a result the multipaths do not have an output current which depends on the common-mode input voltage, and therefore no additional input pairs are necessary. Furthermore, it has the same advantage as the circuit shown in FIG. 12 (i.e., there is no additional noise and offset due to the control transistors or current switches, $Q_5-Q_8$).

While several embodiments of the present invention have been shown and described, it is to be understood that many changes and modifications may be made thereunto without departing from the spirit and scope of the invention as defined in the appended claims.

What is claimed is:

1. A circuit for controlling the transconductance ($g_m$) and common mode output currents of the rail-to-rail input stage of an operational amplifier (opamp), the input stage having an output, at least an N-channel and a P-channel input differential pair of transistors each having a gate voltage and a tail current, the opamp having a common-mode input voltage range including low, intermediate, and high common-mode input voltages, the circuit comprising:

a first current switch coupled to the N-channel input differential pair of transistors, said first current switch having a gate;

a second current switch coupled to the P-channel input differential pair of transistors, said second current switch having a gate;

voltage means coupled to said current switches for providing reference and bias voltages to the gates of said current switches; and, said current switches comparing the common-mode input voltage of the differential input pairs with the current switch gate voltages such that, when low and high common-mode input voltages are applied to the input stage whereby one of said differential input pairs is active and the other differential input pairs is not active, said current switches divide the tail current of the non-active differential input pair into two equal current signals, and means coupling said current switches to the output of the input stage without said current passing through the other, active differential pair or any differential pair having control inputs receiving said common mode input voltage.

2. The circuit according to claim 1, wherein said current switches are responsive to changing common-mode input voltages in order to maintain a constant common-mode output current.

3. The circuit according to claim 2, wherein when intermediate common-mode input voltages are applied to the input stage such that both differential input pairs are active, said current switches regulate the tail currents of the active input pairs and direct these current signals to the output of the input stage.

4. The circuit according to claim 3, wherein said first current switch is an N-channel current switch, and said second current switch is a P-channel current switch.

5. The circuit according to claim 4, wherein said current switches and the input pairs are CMOS transistors.

6. The circuit according to claim 5, wherein said voltage means applies a voltage difference between the gates of the first and second current switches.

7. The circuit according to claim 6, wherein the application of a voltage difference between the gates of the current switches enables the values of said current switches to be small with respect to the input transistors, and thereby decreases noise and offset contributions to the input stage by said current switches.

8. The circuit according to claim 4, wherein said current switches and the input pairs are a combination of BiCMOS and bipolar transistors, respectively.

9. The circuit according to claim 8, further comprising:

an additional N-channel pair of MOS transistors coupled to the first current switch;

an additional P-channel pair of MOS transistors coupled to the second current switch;

voltage means coupled to the gates of the P-channel and N-channel MOS transistors for providing reference and bias voltage signals to said additional pairs; and said additional pairs of MOS transistors eliminating noise and offset contributions in the input stage caused by said current switches.

10. A circuit according to claim 1, wherein said output is connected directly to said current switches.

11. A method of controlling the $g_m$ and common-mode output currents of a rail-to-rail input stage receiving low and high common-mode input voltages, the input stage having first and second input differential pairs of transistors and an output, the method comprising the steps of:

connecting current switches to the input pairs of transistors;

comparing the common-mode input voltage with a voltage value determined by the current switches;

dividing the tail current of the non-active input pair into two equal parts; and feeding the two equal current signals to the output of the input stage by bypassing the active input pair and any differential input pair having control inputs receiving said common-mode input voltage.

12. An rail-to-rail input stage circuit of an operational amplifier (op amp), the input stage circuit comprising:

an output;

a first and a second pair of input differential transistors, each transistor having a control input and a tail current, the input stage circuit having a common mode input range including low, intermediate and high common-mode input voltages, in said low range said first input differential pair of transistors being inactive and in said high range said second input pair of differential transistors being inactive;

a first pair of current switches, each current switch of said first pair of current switches having a control input and a main current path coupled to the first input differential pair of transistors and to said output, said coupling of the first pair of current switches to the output excluding said second input differential pair of transistors and any other differential input pair having a control input receiving the common-mode input voltage;

a second pair of current switches, said second current pair of current switches having a control input and a main current path coupled to the second differential pair of transistors and to said output, said coupling to the output excluding said first input differential pair of transistors and any other differential input pair having a control input receiving the common-mode input voltage; and means for controlling said first and second pair of current switches such that (i) when said first differential input pair of transistors is inactive said first pair of current switches divides the tail current of said inactive first input differential pair into two currents supplied to said output and (ii) when said second input differential pair of is inactive said second pair of current switches divides the tail current of said second input differential pair into two currents supplied to said output.

13. A circuit according to claim 12, wherein said tail currents are divided into two equal current signals by each of said first and second pairs of current switches.

14. A circuit according to claim 12, wherein said means for controlling includes voltage means coupled to said first and second pairs of current switches for providing reference and bias voltages to each of said current switches.

15. A circuit according to claim 12, wherein said output is connected directly to each main current path of said current switches.

16. The circuit according to claim 12, wherein said current switches and the input differential pairs are bipolar transistors.

17. The circuit according to claim 16, wherein the first and second input pairs include a PNP and an NPN input pair, respectively, said circuit further comprising:

a first pair of resistors coupled to the emitters of said first Bipolar current switch and the PNP input pair;

a second pair of resistors coupled to the emitters of said second Bipolar current switch and the NPN input pair; and said first and second pairs of resistors reducing noise and offset contributions of the current switches by lowering the transconductance ($g_m$) of said current switches.

18. The circuit according to claim 16, wherein the first and second input pairs include a PNP and an NPN input pair, respectively, said circuit further comprising:

a first pair of resistors coupled to said first current switch and the PNP input pair;

a second pair of resistors coupled to said second current switch and the NPN input pair; and said first and second pairs of resistors reducing noise and offset contributions of the current switches by lowering the transconductance ($g_m$) of said current switches.

* * * * *